United States Patent
Tsai et al.

(10) Patent No.: US 9,784,814 B2
(45) Date of Patent: Oct. 10, 2017

(54) METHOD AND SYSTEM FOR MEASURING AND CALIBRATING IMAGING MAGNETIC FIELD IN MAGNETIC RESONANCE APPARATUS

(71) Applicant: Shanghai United Imaging Healthcare Co., Ltd., Shanghai (CN)

(72) Inventors: Kunyu Tsai, Shanghai (CN); Weiguo Zhang, Shanghai (CN); Qiang Zhang, Shanghai (CN)

(73) Assignee: SHANGHAI UNITED IMAGING HEALTHCARE CO., LTD., Shanghai (CN)

( * ) Notice: Subject to any disclaimer, the term of this patent is extended or adjusted under 35 U.S.C. 154(b) by 757 days.

(21) Appl. No.: 14/155,166

(22) Filed: Jan. 14, 2014

(65) Prior Publication Data

US 2014/0347049 A1    Nov. 27, 2014

(30) Foreign Application Priority Data

May 21, 2013  (CN) .......................... 2013 1 0191003

(51) Int. Cl.
*G01V 3/00* (2006.01)
*G01R 35/00* (2006.01)
(Continued)

(52) U.S. Cl.
CPC ..... *G01R 35/005* (2013.01); *G01R 33/56563* (2013.01); *G01R 33/58* (2013.01); *G01R 33/243* (2013.01)

(58) Field of Classification Search
CPC .............. G01R 33/3415; G01R 33/543; G01R 33/5659; G01R 33/36; A61B 5/055
(Continued)

(56) References Cited

U.S. PATENT DOCUMENTS 5,465,719 A     11/1995  Itagaki et al.
2001/0041819 A1  11/2001  Goto
(Continued)

FOREIGN PATENT DOCUMENTS

CN        1336558      2/2002
CN      101144852      3/2008
(Continued)

OTHER PUBLICATIONS

English translation of Office Action issued in CN201310191003 dated May 27, 2016, 12 pages.

*Primary Examiner* — Walter L Lindsay, Jr.
*Assistant Examiner* — Frederick Wenderoth
(74) *Attorney, Agent, or Firm* — Metis IP LLC

(57) ABSTRACT

A method and a system for measuring and calibrating an imaging magnetic field in a magnetic resonance apparatus are provided. The method includes: providing the imaging magnetic field, where the imaging magnetic field is adapted for scanning an object; sampling a signal corresponding to the imaging magnetic field; processing the signal to obtain an actual magnetic field intensity; and calibrating based on a difference between the actual magnetic field intensity and a target magnetic field intensity. The system includes: a magnetic component, adapted for scanning an object to be imaged; a sampling unit, adapted for sampling a signal corresponding to the imaging magnetic field; a processing unit, adapted for processing the signal to obtain an actual magnetic field intensity; a calibration unit, adapted for calibrating based on a difference between the actual magnetic field intensity and a target magnetic field intensity; and a control unit, adapted for controlling the system.

39 Claims, 6 Drawing Sheets

(51) Int. Cl.
*G01R 33/565* (2006.01)
*G01R 33/58* (2006.01)
*G01R 33/24* (2006.01)

(58) Field of Classification Search
USPC ........................................................ 399/307
See application file for complete search history.

(56) References Cited

U.S. PATENT DOCUMENTS

| | | |
|---|---|---|
| 2008/0068009 A1 | 3/2008 | Gao et al. |
| 2010/0237869 A1* | 9/2010 | Griswold ........... G01R 33/5612 324/322 |
| 2011/0148411 A1* | 6/2011 | Bottomley ........... G01R 33/288 324/309 |
| 2011/0184284 A1* | 7/2011 | McKay ................ A61B 8/4254 600/437 |
| 2011/0215807 A1* | 9/2011 | Misic ................ G01R 33/3678 324/322 |
| 2013/0113486 A1* | 5/2013 | Imamura .............. G01R 33/341 324/322 |
| 2014/0229141 A1 | 8/2014 | Fallone et al. |

FOREIGN PATENT DOCUMENTS

| | | |
|---|---|---|
| CN | 102150222 | 8/2011 |
| CN | 101509964 | 5/2012 |
| CN | 101427919 | 10/2012 |

* cited by examiner

METHOD AND SYSTEM FOR MEASURING AND CALIBRATING IMAGING MAGNETIC FIELD IN MAGNETIC RESONANCE APPARATUS

CROSS-REFERENCE TO RELATED APPLICATIONS

The present application claims priority to Chinese patent application No. 201310191003.3, filed on May 21, 2013, and entitled "METHOD AND SYSTEM FOR MEASURING AND CALIBRATING IMAGING MAGNETIC FIELD IN MAGNETIC RESONANCE APPARATUS", the entire disclosure of which is incorporated herein by reference.

TECHNICAL FIELD

The present disclosure generally relates to magnetic resonance technology, and more particularly, to a method and a system for measuring and calibrating an imaging magnetic field in a magnetic resonance apparatus.

BACKGROUND

A magnetic resonance apparatus generally includes a superconducting coil, a gradient coil, a radio-frequency (RF) coil, a computer system and other auxiliary equipments.

The superconducting coil is adapted for generating a main imaging magnetic field, and the gradient coil is adapted for proving a gradient field, which can be used to cooperate with the main imaging magnetic field to form an imaging magnetic field (referred to as $B_0$ field for short). The RF coil includes a transmitter coil and a receiver coil. The transmitter coil is usually a body coil. The transmitter coil transmits a RF pulse to stimulate protons in human body to resonate. The receiver coil receives a magnetic resonance signal emitted from the human body. The computer system controls pulse excitation, signal sampling, data operation, image display and etc.

However, the $B_0$ filed has disadvantages of non-uniformity and drift.

In magnetic resonance imaging, a high uniform field is beneficial for improving signal-to-noise ratio of image, ensuring an accurate spatial orientation, reducing artifacts, and improving scan view and etc.

Currently, a plurality of methods for improving uniformity of the imaging magnetic field are provided in practical applications. For example, a method for calibrating an imaging magnetic field in a magnetic resonance apparatus is provided in a Chinese patent application CN101509964C. The calibration method applies a sequence of navigation echo in data sampling, the navigation echo and an image echo are from different spatial dimensions, and a phase encoding gradient is applied only before sampling the image echo. Therefore, a two dimensional image data and a two dimensional navigation data are obtained. Based on the sampled data, an image processing is performed to calibrate the non-uniformity of the imaging magnetic field.

Besides the non-uniformity, stability is also an important factor to evaluate the imaging magnetic field. The stability of the imaging magnetic field is classified into thermal stability and time stability. The gradient coil adapted for providing the gradient field releases a lot of heat, which would result in temperature rising of the magnet warm bore. Furthermore, the temperature of the magnet warm bore may rise because of eddy currents, resulting in variation of magnetic conductivity, which will further result in drift of the imaging magnetic field and a negative effect on image quality. A method for avoiding magnetic field drift by controlling temperature variation is provided in a Chinese patent application CN101427919C.

However, the methods mentioned above either require many additional hardware to correct for anomalies in the imaging magnetic field, or correct the image in a post-acquisition process, which may result in poor quality of images and require further improvement.

SUMMARY

In order to solve the problems mentioned above, a method for measuring and calibrating an imaging magnetic field in a magnetic resonance apparatus is provided in this disclosure. The method may include: providing the imaging magnetic field, where the imaging magnetic field is adapted for scanning an object to be imaged; sampling a signal corresponding to the imaging magnetic field; processing the signal to obtain an actual magnetic field intensity; and performing calibration based on a difference between the actual magnetic field intensity and a target magnetic field intensity.

In some embodiments, the step of providing the imaging magnetic field includes: providing the imaging magnetic field by a magnetic component in the magnetic resonance apparatus; the step of sampling a signal corresponding to the imaging magnetic field includes: providing a measurement RF signal to stimulate a monitoring sample and generate a measurement magnetic resonance signal corresponding to the imaging magnetic field; and sampling the measurement magnetic resonance signal; and the step of processing the signal to obtain an actual magnetic field intensity includes: obtaining the actual magnetic field intensity according to the measurement magnetic resonance signal based on magnetic resonance principle.

In some embodiments, the step of providing a measurement RF signal includes: providing the measurement RF signal by a probe or a body coil fixed in the magnetic component.

In some embodiments, in the step of providing a measurement RF signal to stimulate a monitoring sample, the monitoring sample generates the measurement magnetic resonance signal corresponding to the imaging magnetic field.

In some embodiments, a method for forming the measurement RF signal includes: adopting protons as the monitoring sample to generate the measurement RF signal, where the protons are same with or different from protons in an imaging process.

In some embodiments, the step of performing calibration includes: calibrating the imaging magnetic field.

In some embodiments, the imaging magnetic field is measured and calibrated before scanning the object to be imaged.

In some embodiments, the imaging magnetic field is measured and calibrated in a process of scanning the object to be imaged.

In some embodiments, the step of sampling the measurement magnetic resonance signal includes: obtaining the measurement magnetic resonance signal in a manner of multiple-stimulation and multiple-sampling, or in a manner of single-stimulation and multiple-sampling.

In some embodiments, wherein the step of sampling the measurement magnetic resonance signal includes: sampling a group of measurement magnetic resonance signals; and the step of processing the signal to obtain an actual magnetic field intensity includes: establishing a physical model of the actual magnetic field intensity based on the group of measurement magnetic resonance signals, so as to predict change of the actual magnetic field intensity.

In some embodiments, the step of performing calibration based on a difference between the actual magnetic field intensity and a target magnetic field intensity includes: obtaining an imaging magnetic field calibration value based on the difference between the actual magnetic field intensity and the target magnetic field intensity; obtaining a current calibration value of the magnetic component according to the imaging magnetic field calibration value; and calibrating the imaging magnetic field provided by the magnetic component based on the current calibration value of the magnetic component, where the difference between the actual magnetic field intensity and the target magnetic field intensity is divided into a uniform deviation, a linear deviation and a high-order deviation after calculation.

In some embodiments, the magnetic component includes a gradient coil; the step of obtaining a current calibration value of the magnetic component according to the imaging magnetic field calibration value includes: obtaining a current calibration value of the gradient coil according to the imaging magnetic field calibration value; and the step of calibrating the imaging magnetic field provided by the magnetic component based on the current calibration value of the magnetic component includes: calibrating a current of the gradient coil to calibrate the linear deviation.

In some embodiments, the magnetic component further includes a shim coil; the step of obtaining a current calibration value of the magnetic component according to the imaging magnetic field calibration value includes: obtaining a current calibration value of the shim coil according to the imaging magnetic field calibration value; and the step of calibrating the imaging magnetic field provided by the magnetic component based on the current calibration value of the magnetic component includes: calibrating a current of the shim coil to calibrate the linear deviation and the high-order deviation.

In some embodiments, the magnetic component further includes a drift supply coil for a main imaging magnetic field; the step of obtaining a current calibration value of the magnetic component according to the imaging magnetic field calibration value includes: obtaining a current calibration value of the drift supply coil for the main imaging magnetic field according to the imaging magnetic field calibration value; and the step of calibrating the imaging magnetic field provided by the magnetic component based on the current calibration value of the magnetic component includes: calibrating a current of the drift supply coil for the main imaging magnetic field to calibrate the uniform deviation.

In some embodiments, the magnetic component further performs image reconstruction; and the step of performing calibration based on a difference between the actual magnetic field intensity and a target magnetic field intensity includes: performing the image reconstruction according to data obtained by the actual magnetic field intensity in combination with the difference between the actual magnetic field intensity and the target magnetic field intensity, so as to output a calibrated image.

In some embodiments, the step of sampling a signal corresponding to the imaging magnetic field includes: inducing a change of the imaging magnetic field to form an alternating electromotive force corresponding to the imaging magnetic field, and sampling the alternating electromotive force; and the step of processing the signal to obtain an actual magnetic field intensity includes: obtaining the actual magnetic field intensity according to the alternating electromotive force based on electromagnetic induction principle.

In one embodiment, a system for measuring and calibrating an imaging magnetic field in a magnetic resonance apparatus is provided. The system includes: a magnetic component, adapted for scanning an object to be imaged; a sampling unit, adapted for sampling a signal corresponding to the imaging magnetic field; a processing unit, adapted for processing the signal to obtain an actual magnetic field intensity; a calibration unit, adapted for performing calibration based on a difference between the actual magnetic field intensity and a target magnetic field intensity; and a control unit, connected to the magnetic component, the sampling unit, the processing unit and the calibration unit, and adapted for controlling the magnetic component to provide the imaging magnetic field, controlling the sampling unit to sample the signal, controlling the processing unit to process the signal, and controlling the calibration unit to calibrate.

In some embodiments, the sampling unit includes a plurality of probes adapted for, after a measurement RF signal stimulates a plurality of monitoring samples and generates a measurement magnetic resonance signal corresponding to the measurement RF signal, sampling the measurement magnetic resonance signal; a sampling channel adapted for transmitting the measurement magnetic resonance signal; and the processing unit is adapted for obtaining the actual magnetic field intensity according to the measurement magnetic resonance signal based on magnetic resonance principle.

In some embodiments, the plurality of monitoring samples is disposed in the plurality of probes, where the plurality of monitoring samples are same with or different from a sample which generates an imaging magnetic resonance signal.

In some embodiments, the plurality of probes are fixed on a surface of the magnetic component.

In some embodiments, the magnetic resonance apparatus further includes a local coil, and the plurality of probes are embedded in the local coil.

In some embodiments, the plurality of probes are distributed on a gradient orthogonal axes.

In some embodiments, the number of the plurality of probes is at least four, and the plurality of probes are distributed on three gradient orthogonal axes symmetrically.

In some embodiments, the plurality of probes are transmitting-receiving RF coils, or transmitting RF coils.

In some embodiments, each of the plurality of probes has an adjacent wing at one side.

In some embodiments, the plurality of probes have a solenoid structure.

In some embodiments, a magnetic material is disposed in the plurality of probes to generate a local magnetic field to compensate the imaging magnetic field.

In some embodiments, the local magnetic field changes with a voltage applied on the magnetic material, so as to calibrate a local distribution of the imaging magnetic field.

In some embodiments, the magnetic resonance apparatus further includes a body coil adapted for providing the measurement RF signal and an imaging RF signal; the magnetic component includes a gradient coil, and the control unit is connected to the gradient coil, the body coil, the plurality of probes and the sampling channel, where the control unit is adapted for controlling the gradient coil to provide the imaging magnetic field and controlling the body coil to provide the imaging RF signal, so as to generate the imaging magnetic resonance signal; and the control unit is further adapted for controlling the body coil to provide the measurement RF signal, controlling the plurality of probes to sample the measurement magnetic resonance signal, and controlling the sampling channel to transmit the imaging magnetic resonance signal and the measurement magnetic resonance signal synchronously, in a process of magnetic resonance imaging.

In some embodiments, the sampling channel includes a plurality of channels, where a part of the plurality of channels are used to transmit the imaging magnetic resonance signal, and others are used to transmit the measurement magnetic resonance signal.

In some embodiments, the magnetic resonance apparatus further includes a body coil adapted for providing the measurement RF signal and an imaging RF signal; the magnetic component includes a gradient coil, and the control unit is connected to the gradient coil, the body coil, the plurality of probes and the sampling channel, where the control unit is adapted for controlling the gradient coil to provide the imaging magnetic field, controlling the body coil to provide the measurement RF signal, controlling the plurality of probes to sample the measurement magnetic resonance signal, and controlling the sampling channel to transmit the measurement magnetic resonance signal, before a process of magnetic resonance imaging.

In some embodiments, the control unit controls the body coil to stimulate the monitoring sample once or multiple times, and control the plurality of probes to sample the measurement magnetic resonance signal multiple times.

In some embodiments, the control unit is adapted for controlling the plurality of probes to sample a group of measurement magnetic resonance signals, the processing unit is adapted for establishing a physical model of the actual magnetic field intensity based on the group of measurement magnetic resonance signals, so as to predict change of the actual magnetic field intensity.

In some embodiments, the calibration unit includes: a first calculation unit, adapted for obtaining an imaging magnetic field calibration value according to the difference between the actual magnetic field intensity and the target magnetic field intensity; a second calculation unit, adapted for obtaining a current calibration value of the magnetic component according to the imaging magnetic field calibration value; where the control unit is connected to the second calculation unit and the magnetic component, and adapted for changing a current in the magnetic component according to the current calibration value of the magnetic component, so as to calibrate the imaging magnetic field, and the difference between the actual magnetic field intensity and the target magnetic field intensity is divided into a uniform deviation, a linear deviation and a high-order deviation after calculation.

In some embodiments, the magnetic component includes a gradient coil; the first calculation unit is adapted for obtaining an imaging magnetic field calibration value of a linear field according to the difference between the actual magnetic field intensity and the target magnetic field intensity; the second calculation unit is adapted for obtaining a current calibration value of the gradient coil according to the imaging magnetic field calibration value of the linear field; and the control unit is connected to the second calculation unit and the gradient coil, and adapted for calibrating a current of the gradient coil according to the current calibration value of the gradient coil, so as to calibrate the linear deviation.

In some embodiments, the magnetic component further includes a shim coil adapted for providing a compensation imaging magnetic field; the calibration unit further includes: a third calculation unit, adapted for obtaining a current calibration value of the shim coil according to the imaging magnetic field calibration value; and the control unit is connected to the third calculation unit and the shim coil, and adapted for changing a current in the shim coil according to the current calibration value of the shim coil, so as to calibrate the linear deviation and the high-order deviation.

In some embodiments, the magnetic component further includes a drift supply coil for main imaging magnetic field which is adapted for providing a compensation imaging magnetic field; the calibration unit further includes: a fourth calculation unit, adapted for obtaining a current calibration value of the drift supply coil for main imaging magnetic field according to the imaging magnetic field calibration value; and the control unit is connected to the fourth calculation unit and the drift supply coil for main imaging magnetic field, and adapted for changing a current in the drift supply coil for main imaging magnetic field according to the current calibration value of the drift supply coil for main imaging magnetic field, so as to calibrate the uniform deviation.

In some embodiments, the magnetic component further includes an image reconstruction unit, where the image reconstruction unit is connected to the calibration unit, and adapted for reconstructing an image according to data obtained by the actual magnetic field intensity in combination with the difference between the actual magnetic field intensity and the target magnetic field intensity, so as to output a calibrated image.

In some embodiments, the sampling unit includes an induction coil adapted for inducing a change of the imaging magnetic field to form an alternating electromotive force corresponding to the imaging magnetic field; and the processing unit is configured to obtain an actual magnetic field intensity according to the alternating electromotive force based on an electromagnetic induction principle.

DETAILED DESCRIPTION

Magnetic resonance apparatuses require a high uniformity of magnetic field intensity. Besides a certain spatial distribution, the magnetic field intensity may also change with time, which is also known as imaging magnetic field drift. Therefore, the quality of images output by conventional magnetic resonance apparatuses is poor.

In order to clarify the objects, characteristics and advantages of the disclosure, the embodiments of the present disclosure will be described in detail in conjunction with the accompanying drawings.

In embodiments of the present disclosure, a method for measuring and calibrating an imaging magnetic field of a magnetic resonance apparatus is provided. The method includes: providing an imaging magnetic field, where the imaging magnetic field is adapted for scanning an object to be imaged; sampling a signal corresponding to the imaging magnetic field; processing the signal to obtain an actual magnetic field intensity; and performing calibration based on a difference between the actual magnetic field intensity and a target magnetic field intensity. According to embodiments of the present disclosure, image quality is improved by measuring the actual magnetic field intensity and calibrating the imaging magnetic field for magnetic resonance based on the difference between the actual magnetic field intensity and the target magnetic field intensity.

Figure 1:
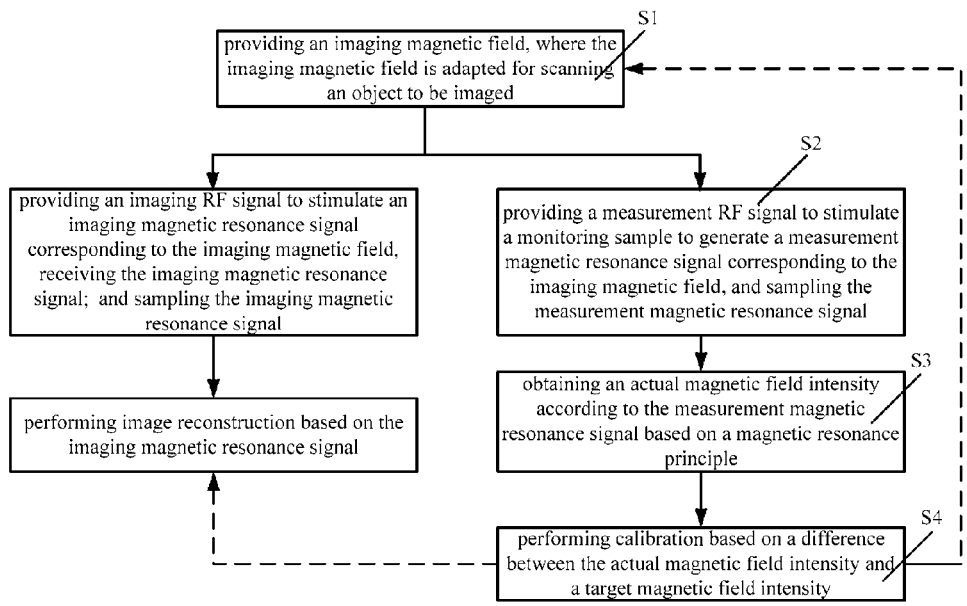
FIG. 1 illustrates a schematic flow chart of a method for measuring and calibrating an imaging magnetic field in a magnetic resonance apparatus according to one embodiment.

Referring to FIG. 1, FIG. 1 illustrates a schematic flow chart of a method for measuring and calibrating an imaging magnetic field of a magnetic resonance apparatus according to one embodiment of the present disclosure. It should be noted that, the imaging magnetic field is measured and calibrated based on magnetic resonance principle in one embodiment, but the present disclosure is not limited thereto. Other principles, such as electromagnetic induction principle, may also be adopted for measuring and calibrating the imaging magnetic field. Specifically, the method may include:

step S1, providing an imaging magnetic field adapted for scanning an object to be imaged;

step S2, providing a measurement RF signal to stimulate a monitoring sample to generate a measurement magnetic resonance signal corresponding to the imaging magnetic field, and sampling the measurement magnetic resonance signal;

step S3, obtaining an actual magnetic field intensity according to the measurement magnetic resonance signal based on magnetic resonance principle; and step S4, performing calibration based on a difference between the actual magnetic field intensity and a target magnetic field intensity.

The steps of the method are described in detail below.

In step S1, an imaging magnetic field is provided, where the imaging magnetic field is adapted for scanning an object to be imaged.

Generally, a magnetic resonance apparatus includes a cavity having a cylindrical shape, the inside of the cavity serves as a sampling area, and the object to be imaged is disposed in the sampling area. It should be noted that, a magnetic component is disposed in the sidewall of the cavity, and the magnetic component is adapted for providing the imaging magnetic field, so as to obtain a magnetic resonance signal for generating a magnetic resonance image.

In one embodiment, intensity of the imaging magnetic field is measured in real time at a certain position, in order to calibrate the imaging magnetic field. A high quality magnetic resonance image may be obtained after the imaging magnetic field is calibrated. In some embodiments, a high quality magnetic resonance image may be obtained by combining image reconstruction and calibration of magnetic field intensity, which means perform calibration of magnetic field intensity in the process of image reconstruction.

In one embodiment, the magnetic component may include a superconducting coil and a gradient coil, where the superconducting coil is adapted for generating a main imaging magnetic field, and the gradient coil is adapted for generating a gradient field. The imaging magnetic field for obtaining a magnetic resonance signal in the cavity of the magnetic resonance apparatus is provided by a body coil and the gradient coil together. The distribution of the imaging magnetic field can be expressed as an equation shown below:

$$B_0(t,x,y,z) = B_{00}(t) + \Sigma_{n=1}^{N} B_n(t,x^n,y^n,z^n)$$

where $B_0$ represents the imaging magnetic field. Taking X-axis as an example, an actual magnetic field intensity generated by the superconducting coil and the gradient coil can be expressed as an equation: $B_0 = B'_{00} + GX + aX^2 + cX^3$.

It should be noted that, the expression of the magnetic field intensity is only expanded to a third-order term. Higher order terms have little effect on the image and more complex active shim coils are required to obtain them. Therefore, the higher order terms are compensated by passive shimming in practical application.

A target imaging magnetic field to the imaging magnetic field may be determined based on properties of the superconducting coil and the gradient coil, such as location, material, quantity and etc., in conjunction with design specifications of image quality. A high quality image, which can meet design specifications, can be obtained based on the target imaging magnetic field. In one embodiment, the target imaging magnetic field may be expressed as $B_{00}$.

The target imaging magnetic field may be a standard to calibrate the imaging magnetic field. Taking X-axis as an example, a calibration value of the imaging magnetic field may be expressed as Equation (1):

$$\Delta = (B'_{00} - B_{00}) + GX + aX^2 + cX^3 \qquad \text{Equation (1)}$$

where $B'_{00} - B_{00}$ represents a uniform deviation, $GX$ represents a linear deviation, and $aX^2 + cX^3$ represents a high-order deviation of the imaging magnetic field. In one embodiment, different calibration targets and methods can be implemented to calibrate the uniform deviation, the liner deviation and the high-order deviation.

It should be noted that, the method for providing the imaging magnetic field based on the magnetic component is well known to those skilled in the art, and is not described in detail herein. It should be also noted that, the composition of the magnetic component is not described here and the present disclosure should not be limited thereto.

In step S2, a measurement RF signal is provided to stimulate a monitoring sample to generate a measurement magnetic resonance signal corresponding to the imaging magnetic field.

In one embodiment, the body coil disposed in the cylindrical cavity provides an imaging RF signal. The body coil also provides the measurement RF signal to stimulate the monitoring sample, so as to generate the measurement magnetic resonance signal corresponding to the imaging magnetic field provided in step S1. The measurement magnetic resonance signal may be sampled by a plurality of probes disposed in the cavity.

In some embodiments, if the plurality of probes are transceiver coils, the body coil may only provide the imaging RF signal, while the plurality of probes provide the measurement RF signal and sample the measurement magnetic resonance signal.

Specifically, the monitoring sample for generating the measurement magnetic resonance signal may be protons which are same with the imaging magnetic resonance signal, such as H protons, so as to obtain a good integration with the magnetic resonance apparatus. It should be noted that, the monitoring sample should not be limited thereto. In some embodiments, the monitoring sample may be protons which are different from the imaging magnetic resonance signal, so as to reduce interferences which may be caused in the imaging process by measurement and calibration.

The plurality of probes may be disposed at a fixed position. Position information of the plurality of probes can be obtained in advance, so as to measure the imaging magnetic field at a certain position. But the present disclosure is not limited thereto.

Specifically, the spatial relationships between the plurality of probes may be critical. If the plurality of probes are disposed on a proper position, fewer probes may be needed to obtain a high quality measurement result.

Figure 2:
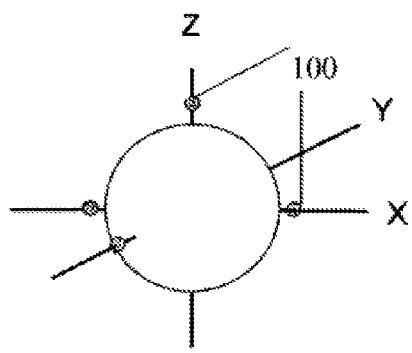
FIG. 2 schematically illustrates a plurality of probes for stimulating signals in a step S2 of the method shown in FIG. 1 according to one embodiment.

Referring to FIG. 2, a plurality of probes are schematically illustrated according to one embodiment. In one embodiment, calibration of a uniform field and a linear field is taken as an example. The magnetic field intensity has a gradient distribution on three gradient orthogonal axes (x, y and z), respectively. By disposing the plurality of probes 100 on the three gradient orthogonal axes, only four or more probes 100 are needed to calibrate the uniform field and the linear field.

The plurality of probes may be disposed in the magnetic component. For example, the plurality of probes may be disposed in the gradient coil. In some embodiments, the plurality of probes may be disposed on a surface of the magnetic component, in order to measure magnetic field intensity in a wide range.

In one embodiment, stimulating the measurement magnetic resonance signal and sampling the measurement magnetic resonance signal are performed in the scanning process of the apparatus, which means the measurement of magnetic field intensity is synchronous with the imaging process.

Specifically, the step of the magnetic resonance apparatus stimulating magnetic resonance signals is based on an imaging sequence in the imaging process. Therefore, a measurement RF signal synchronized with the imaging RF signal can be added in the imaging sequence. The imaging RF signal is used to stimulate the imaging magnetic resonance signal, while the measurement RF signal is used to stimulate the measurement magnetic resonance signal, so as to measure the imaging magnetic field in real time. In other words, the measurement RF signal is stimulated and sampled with an existed imaging sequence, which may obtain a good integration with a conventional magnetic resonance apparatus and simplify the measurement and calibration process for the imaging magnetic field.

Also in step S2, the measurement magnetic resonance signal is sampled. A plurality of channels, adapted for transmitting magnetic resonance signals, are set in the magnetic resonance apparatus. After the measurement magnetic resonance signal is sampled by the probes, a part of the plurality of channels is occupied to transmit the measurement magnetic resonance signal stimulated by the measurement RF signal, while other channels continue to transmit the imaging magnetic resonance signal stimulated by the imaging RF signal.

In some embodiments, a measurement sampling signal synchronized with an imaging sampling signal is added in the imaging sequence, in order to obtain the measurement magnetic resonance signal based on the measurement sampling signal in the process of obtaining the imaging magnetic resonance signal by sampling the imaging sampling signal.

Figure 3:
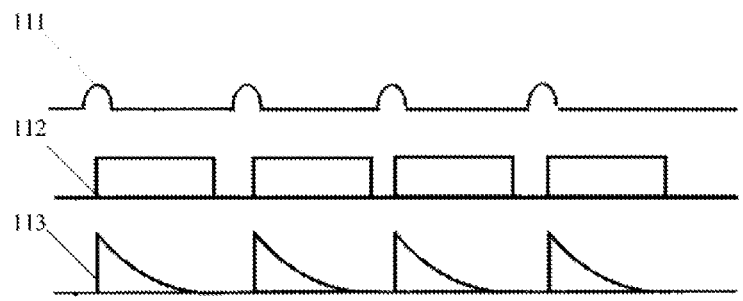
FIG. 3 schematically illustrates a measurement RF stimulation signal, a measurement sampling control signal and a measurement magnetic resonance signal in the step S2 of the method shown in FIG. 1 according to one embodiment.

It should be noted that, in step S2, a multiple-stimulation and multiple-sampling manner may be adopted. As shown in FIG. 3, in a measurement cycle, four measurement RF stimulation signals 111 are set, and four measurement control sampling signals 112 are set correspondingly, so as to obtain four measurement magnetic resonance signals 114.

Figure 4:
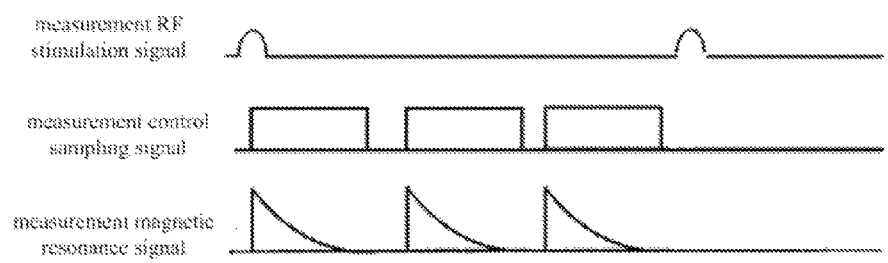
FIG. 4 schematically illustrates a measurement RF stimulation signal, a measurement sampling control signal and a measurement magnetic resonance signal in the step S2 of the method shown in FIG. 1 according to one embodiment.

Similarly, a single-stimulation and multiple-sampling manner may be adopted. As shown in FIG. 4, in a measurement cycle, three measurement control sampling signals are set corresponding to one measurement RF stimulation signal, so as to obtain three measurement magnetic resonance signals.

It should be noted that, both FIG. 3 and FIG. 4 schematically illustrate a sampling process for frequency information of a measurement magnetic resonance signal, but the present disclosure should not be limited thereto. The measurement magnetic resonance signal also includes phase information. In some embodiments, the phase information of the measurement magnetic resonance signal may be sampled.

In step S3, an actual magnetic field intensity is obtained according to the measurement magnetic resonance signal based on magnetic resonance principle.

The measurement magnetic resonance signal includes frequency information and phase information. The actual magnetic field intensity may be obtained based on the frequency information according to an equation shown below:

$$B(r, \theta, \varphi, t) = \frac{f(r, \theta, \varphi, t)}{\gamma}$$

where (r,θ,φ) represents spatial coordinates of a point in polar coordinates form, and f represents frequency.

An instantaneous actual magnetic field intensity may also be obtained based on the phase information. Phase change accumulated in a time interval τ of the measurement sampling signal may be expressed as: $d\phi = \int_{t0}^{t0+\tau} \gamma B(r,\theta,\phi,t)dt$. If τ is short enough, the actual magnetic field intensity may be obtained according to an equation shown below:

$$B(r, \theta, \varphi, t0) = \frac{\int_{t0}^{t0+\tau} \gamma B(r, \theta, \varphi, t)\, dt}{\tau}.$$

It should be noted that, imaging magnetic field drift is a gradual change process with time. In the process of performing step S2 and step S3, a group of measurement magnetic resonance signals sampled at different time points may be obtained in a step of sampling signals corresponding to the imaging magnetic field.

Specifically, a group of measurement magnetic resonance signals are sampled densely. Afterward, in a step of processing the measurement magnetic resonance signals to obtain the actual magnetic field intensity, a physical model of the actual magnetic field intensity may be established based on the group of measurement magnetic resonance signals densely sampled. The physical model may be used to simulate changes of the actual magnetic field intensity, so as to estimate or predict a distribution of magnetic field intensity in a particular time interval. After the particular time interval, a new group of measurement magnetic resonance signals will be sampled to modify the physical model. Signal sampling frequency can be reduced and measurement efficiency can be improved in this manner.

Figure 6:
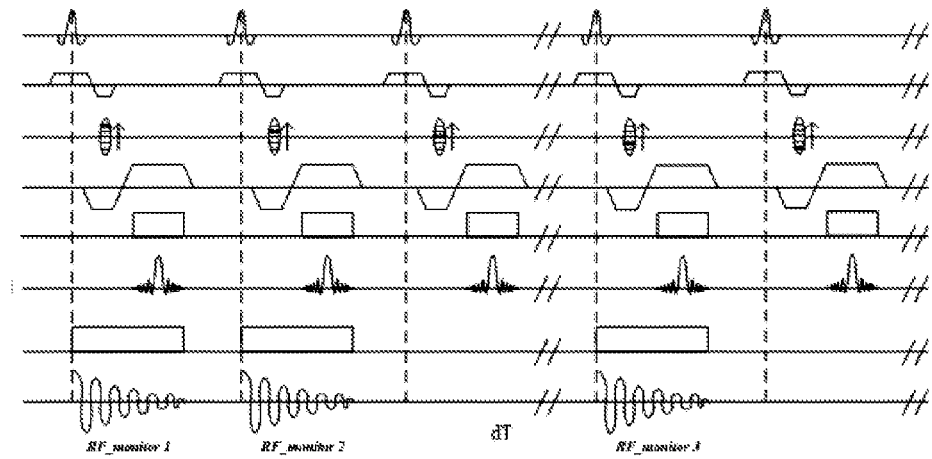
FIG. 6 illustrates a schematic waveform diagram of the step S2 and a step S3 of the method shown in FIG. 1 according to one embodiment.

As shown in FIG. 6, RF_monitor 1 and RF_monitor 2, which represent data corresponding to the measurement magnetic resonance signals obtained by dense sampling, are used to predict a dynamic distribution of the imaging magnetic field within a particular time interval (dT) and to obtain a predicted result. After a time interval of dT, data RF_monitor 3 corresponding to measurement magnetic resonance signals is sampled and is used to modify the predicted result of the dynamic distribution of the imaging magnetic field. In this manner, the signal sampling frequency may be reduced and measurement efficiency may be improved.

In step S4, calibration is performed based on a difference between the actual magnetic field intensity and the target magnetic field intensity. Specifically, after obtaining the actual magnetic field intensity in step S3, an imaging magnetic field calibration value is obtained based on the difference between the actual magnetic field intensity and the target magnetic field intensity, then calibration is performed based on the imaging magnetic field calibration value.

On one hand, the imaging magnetic field is calibrated based on the magnetic field calibration value, whereby the intensity of the imaging magnetic field after calibration is close to the target magnetic field intensity.

In one embodiment, taking the calibration of a current in the gradient coil as an example, an encoding gradient is modified according to the magnetic field calibration value, and a K-space trajectory of the magnetic resonance is calibrated. Specifically, a current calibration value is calculated according to G in Equation (1) which is used to calculate the measurement magnetic resonance signal, and then the current in the gradient coil is calculated to calibrate the linear deviation.

In some embodiments, a current calibration value of the shim coil may be obtained based on the magnetic field calibration value. A current in the shim coil is changed based on the current calibration value of the shim coil, so as to calibrate the linear deviation and the high-order deviation.

In some embodiments, a current calibration value in a drift supply coil for main imaging magnetic field may be obtained based on the magnetic field calibration value. A current in the drift supply coil is changed based on the current calibration value in the drift supply coil to calibrate the uniform deviation.

On the other hand, the image reconstruction is performed according to data obtained by the actual magnetic field intensity in combination with the difference between the actual magnetic field intensity and a target magnetic field intensity, so as to calibrate the deviations in a finally obtained image.

Heretofore, calibration of the magnetic field intensity in real time is achieved. Therefore, a high quality image is obtained after calibration, and the measurement accuracy is improved.

It should be noted that, in an actual magnetic resonance imaging process, information to control an entire scanning process is configured in a scanning sequence for magnetic resonance imaging, while information of the measurement and calibration process is configured in a measurement calibration sequence. While the scanning sequence of magnetic resonance imaging is run, the measurement calibration sequence is also run. The measurement calibration sequence includes information of the measurement RF signal for stimulating the monitoring sample, the measurement control signal for controlling the sampling time and frequency for the probes and sampling channels to sample the measurement magnetic resonance signals generated by the monitoring sample.

It should also be noted that, in the above embodiments, the steps of stimulating and sampling the measurement magnetic resonance signal are synchronized with the steps of stimulating and sampling the imaging magnetic resonance signals. In some embodiments, the imaging magnetic field is provided, measured and calibrated before the magnetic resonance apparatus images. Specifically, after the imaging magnetic field is provided, the measurement RF signal is provided to stimulate the measurement magnetic resonance signals, the measurement magnetic resonance signal is sampled to obtain the actual magnetic field intensity, and calibration is performed based on the difference between the actual magnetic field intensity and the target magnetic field intensity. The imaging process is performed based on a calibrated imaging filed obtained after the calibration, so as to obtain a high quality image.

A calibration method on sequence level is mentioned above, which is "a current in the gradient coil is calibrated, an encoding gradient is modified according to the magnetic field calibration value, and a K-space trajectory of the magnetic resonance is calibrated". In fact, the calibration of the current in the magnetic components may be performed as the method mentioned above, which means that an information of current calibration magnitude is fed back to the imaging sequence to calibrate current magnitude information of the gradient coil, the shim coil or the drift supply coil for main imaging magnetic field in the imaging sequence, so as to calibrate current magnitudes of these coils. Meanwhile, a computer may be adopted to calibrate current magnitudes in coils according to the current calibration magnitudes. The method for calibrating current magnetic is not limited herein.

In some embodiments, a method based on the electromagnetic induction principle may be adopted to measure. Specifically, the method may include: inducing a change in an imaging magnetic field to form an alternating electromotive force corresponding to the imaging magnetic field, and sampling the alternating electromotive force; and obtaining an actual magnetic field intensity according to the alternating electromotive force based on the electromagnetic induction principle. After the measurement based on the electromagnetic induction principle, a magnetic field calibration, which is similar to the calibration method mentioned in above embodiments, is performed.

Figure 7:
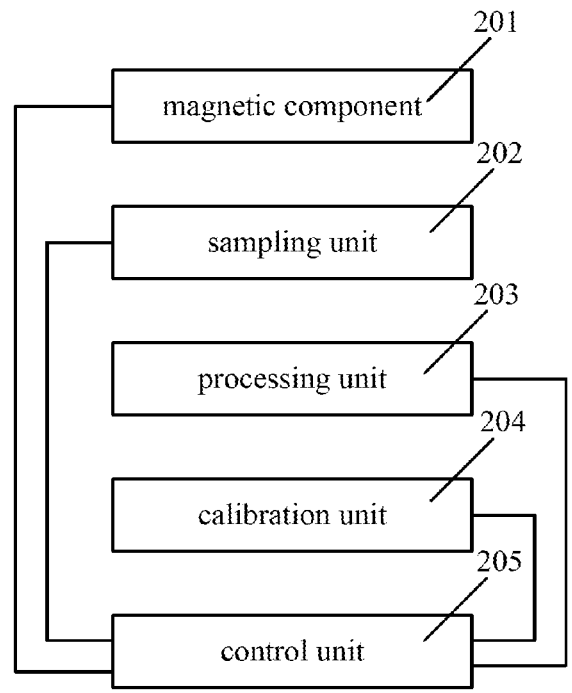
FIG. 7 illustrates a functional block diagram of a system for measuring and calibrating an imaging magnetic field in a magnetic resonance apparatus according to one embodiment.

Referring to FIG. 7, a functional block diagram of a system for measuring and calibrating an imaging magnetic field in a magnetic resonance apparatus is illustrated according to one embodiment. The system may include:

a magnetic component 201, adapted for scanning an object to be imaged;

a sampling unit 202, adapted for sampling a signal corresponding to an imaging magnetic field;

a processing unit 203, adapted for processing the signal to obtain an actual magnetic field intensity;

a calibration unit 204, adapted for performing calibration based on a difference between the actual magnetic field intensity and a target magnetic field intensity;

a control unit 205, connected to the magnetic component 201, the sampling unit 202, the processing unit 203 and the calibration unit 204, and adapted for controlling the magnetic component 201 to provide the imaging magnetic field, controlling the sampling unit 202 to sample the signal, controlling the processing unit 203 to process the signal, and controlling the calibration unit 204 to calibrate.

The system for measuring and calibrating an imaging magnetic field provided in embodiments of the present disclosure may measure and calibrate the imaging field in the magnetic resonance apparatus in real time, whereby the magnetic resonance apparatus after calibration may output a high quality image.

Figure 8:
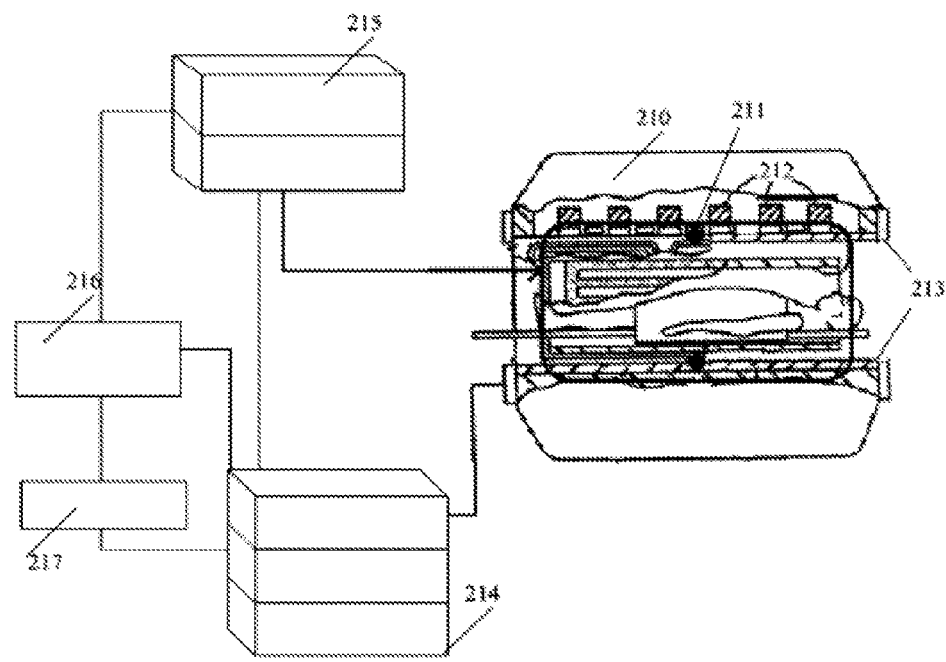
FIG. 8 illustrates a schematic structural diagram of a system for measuring and calibrating an imaging magnetic field in a magnetic resonance apparatus according to one embodiment.

Referring to FIG. 8, a schematic structural diagram of a system for measuring and calibrating an imaging magnetic field in a magnetic resonance apparatus is illustrated according to one embodiment. The imaging magnetic field measurement and calibration in this embodiment is based on the magnetic resonance principle, but it is not limited herein.

Specifically, the magnetic resonance apparatus includes a cavity 210 having a cylindrical shape, where an interior region of the cavity 210 serves as a sampling area, an object to be magnetic resonance imaged is configured to be disposed in the sampling area.

In one embodiment, the system for imaging magnetic field measurement and calibration in the magnetic resonance apparatus includes a magnetic component 212 disposed on an inner sidewall of the cavity 210, where the magnetic component 212 is adapted for providing an imaging magnetic field.

In one embodiment, the magnetic component 212 includes a superconducting coil (not shown) and a gradient coil 219, where the imaging magnetic field in the magnetic resonance apparatus is provided by the superconducting coil and the gradient coil 219.

Specifically, taking an X-axis as an example, an actual magnetic field intensity generated by the superconducting coil and the gradient coil can be expressed as an equation shown below:

$$B_0 = B'_{00} + GX + aX^2 + cX^3.$$

It should be noted that, the expression of the magnetic field intensity is only expanded to a third-order term. Higher order terms have little effect on the image and more complex active shim coils are required to obtain them. Therefore, the higher order terms are compensated by passive shimming in practical application.

In one embodiment, the sampling unit 202 may include a plurality of probes 211 adapted for, after a measurement RF signal stimulates a monitoring sample and generates a measurement magnetic resonance signal corresponding to the measurement RF signal, receiving the measurement magnetic resonance signal.

In one embodiment, the plurality of probes 211 are fixed on a surface of the magnetic component 212, so as to measure magnetic field intensity in a wide range. But the locations of the probes 211 are not limited herein. In some embodiments, the plurality of probes 211 may be fixed on other mechanical structures in the cavity 210. Because the plurality of probes 211 are disposed on fixed positions, position information of the plurality of probes 211 can be obtained in advance, and there is no need to detect the position information of the plurality of probes 211 in a measurement process. But it is not limited herein. In some embodiments, the plurality of probes 211 may be disposed in a non-fixed manner. In some embodiments, the magnetic resonance apparatus may include a local coil, and the plurality of probes 211 may be embedded in the local coil.

Figure 9:
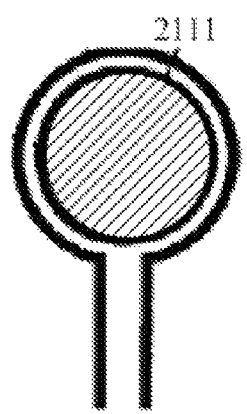
FIG. 9 illustrates a schematic structural diagram of a probe shown in FIG. 8 according to one embodiment.
Figure 10:
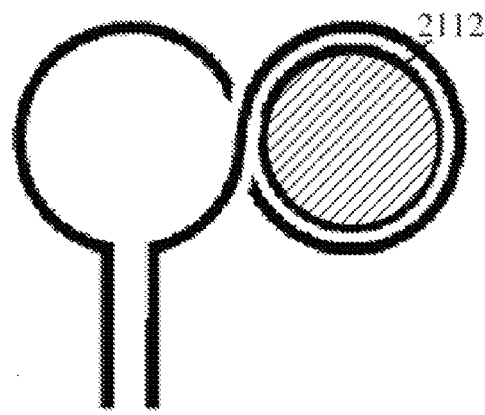
FIG. 10 illustrates a schematic structural diagram of a probe shown in FIG. 8 according to one embodiment.
Figure 11:
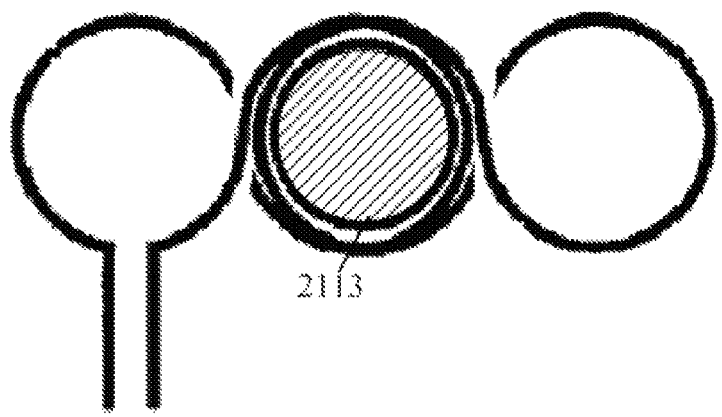
FIG. 11 illustrates a schematic structural diagram of a probe shown in FIG. 8 according to one embodiment.

Referring to FIGS. 9-13, schematic structural diagrams of a probe shown in FIG. 8 are illustrated. As shown in FIG. 9, a probe 2111 may be an annular coil. In some embodiments, as shown in FIG. 10, a probe 2112 may be a coil having an adjacent wing at one side. In some embodiments, as shown in FIG. 11, a probe 2113 may be a coil having adjacent wings at two sides. A coil having adjacent wings has a better ability to resist non-measurement magnetic resonance signals.

Figure 12:
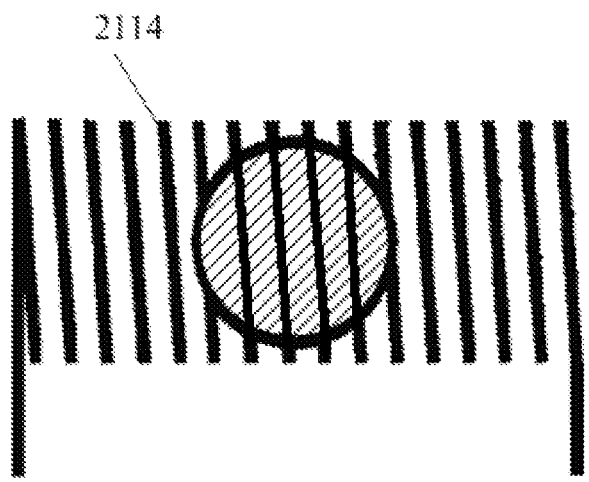
FIG. 12 illustrates a schematic structural diagram of a probe shown in FIG. 8 according to one embodiment.
Figure 13:
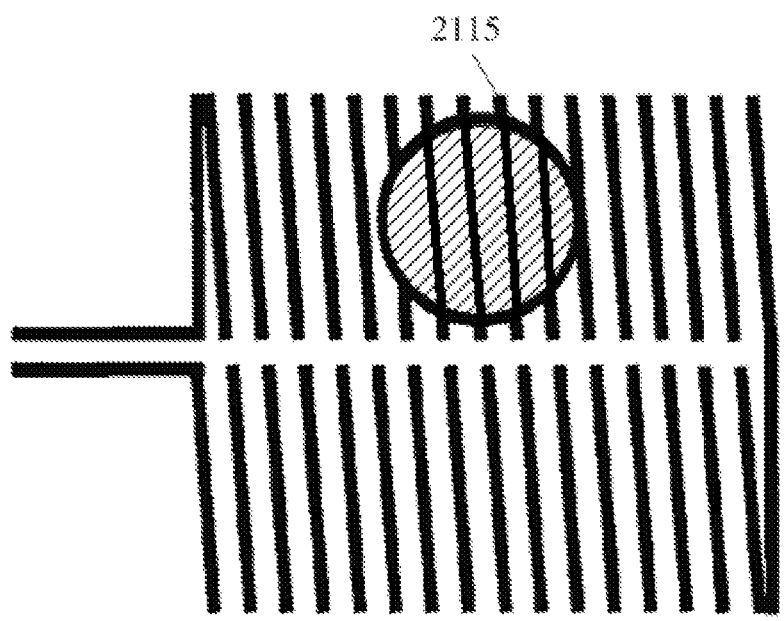
FIG. 13 illustrates a schematic structural diagram of a probe shown in FIG. 8 according to one embodiment.

In one embodiment, the probe 211 may be a receiving coil. Specifically, as shown in FIG. 12, a probe 2114 may be a solenoid-structure coil. In some embodiments, as shown in FIG. 13, a probe 2115 may be a solenoid-structure coil capable of resisting outside interferences, which has a similar principle to the above coils having adjacent wings.

It should be noted that, FIGS. 9-13 show a plurality of implementations of the probe 211, but structure and material of the probe 211 is not limited in this disclosure.

In some embodiments, a magnetic material is disposed in the probe 211, where the magnetic material is adapted for generating a local magnetic field to compensate the imaging magnetic field. The local magnetic field may change with a voltage applied on the magnetic material, so as to calibrate a local distribution of the imaging magnetic field. In other words, magnetism of the magnetic material is changed by changing direction of a voltage applied on two ends of the magnetic material, so as to calibrate the local distribution of the imaging magnetic field and to obtain a uniform imaging magnetic field.

In one embodiment, the probe 211 may be a receiving coil, and the system further includes a body coil adapted for providing a measurement RF signal and an imaging RF signal. But the present disclosure is not limited hereto. In some embodiments, the probe may have functions of both transmitting and receiving RF signals. The probe may provide the measurement RF signal and receive the measurement magnetic resonance signal, while the body coil may only provide the imaging RF signal.

It should be also noted that, the magnetic resonance apparatus usually adopts H protons to generate magnetic resonance. In one embodiment, the probe may adopt protons (H protons), which is same as the imaging magnetic resonance signal, to generate magnetic resonance. But the present disclosure is not limited thereto. In some embodiments, the probe may adopt a kind of protons different from the protons adopted by the magnetic resonance apparatus in the process of imaging.

By adjusting the spatial relationship between the probes in the magnetic resonance apparatus, fewer probes may be needed to obtain a high quality measurement result. Specifically, calibration of a uniform field and a linear field is taken as an example. The magnetic field intensity has a gradient distribution on three gradient orthogonal axes (x, y and z), respectively. By disposing the plurality of probes on the three gradient orthogonal axes in a symmetrical distribution manner, only four or more probes are needed to calibrate the uniform field and the linear field (as shown in FIG. 2).

In one embodiment, the sampling unit further includes a sampling channel 215, adapted for transmitting the measurement magnetic resonance signals. It should be noted that, a plurality of channels are set in a conventional magnetic resonance apparatus. A part of the plurality of channels may be used to transmit imaging magnetic resonance signals, while other channels may be used to transmit measurement magnetic resonance signals. Therefore, the sampling channel adopts existing components (channels) in the conventional magnetic resonance apparatus to transmit measurement magnetic resonance signals, thus a good compatibility with the conventional magnetic resonance apparatus may be obtained and structure of the system for imaging magnetic field measurement and calibration may be simplified.

In one embodiment, the system further includes a control unit 214 which is connected to the body coil, the gradient coil 219, the probe 211, the sampling channel 215 and the processing unit 216. The control unit 214 is adapted for controlling the body coil to provide the measurement RF signal to stimulate the monitoring sample, controlling the probe 211 to sample the measurement magnetic resonance signal, controlling the sampling channel 215 to transmit the measurement magnetic resonance signal, and controlling the processing unit 216 to process the measurement magnetic resonance signal, so as to measure the imaging magnetic field.

It should be noted that, information to control the entire measurement and calibration processes is configured in a measurement and calibration sequence. The control unit 214 runs a magnetic resonance imaging sequence and the measurement and calibration sequence at the same time, and control a time interval, frequency for stimulating the monitoring sample. In some embodiments, the control unit 214 may control the measurement RF signal to stimulate the monitoring sample repeatedly, and control the probe 211 to sample the measurement magnetic resonance signal repeatedly (e.g., adopting signals shown in FIG. 3 to obtain multiple stimulations and multiple samplings). In some embodiments, the control unit 214 may control the measurement RF signal to stimulate the monitoring sample once, and control the probe 211 to sample the measurement magnetic resonance signal repeatedly (e.g., adopting signals shown in FIG. 4 to obtain one stimulation and multiple samplings).

It should be noted that, in some embodiments, before stimulating the imaging magnetic resonance signal, the control unit 214 may control the superconducting coil and the gradient coil to provide the imaging magnetic field, control the body coil to stimulate the monitoring sample to generate the measurement magnetic resonance signal, control the probe 211 to sample the measurement magnetic resonance signal, and control the sampling channel to transmit the measurement magnetic resonance signal, so as to calibrate the imaging magnetic field before the magnetic resonance apparatus start to scan.

Figure 5:
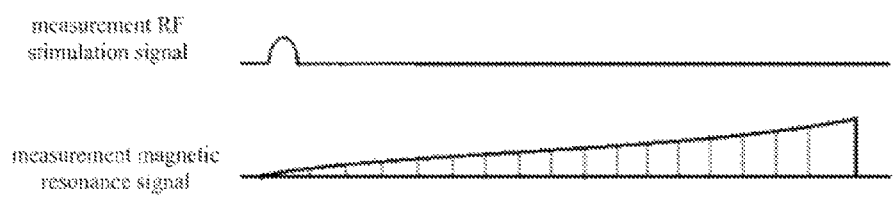
FIG. 5 schematically illustrates a measurement RF stimulation signal, a measurement sampling control signal and a measurement magnetic resonance signal in the step S2 of the method shown in FIG. 1 according to one embodiment.

It should be noted that, the measurement magnetic resonance signal includes frequency information (as shown in FIG. 3 and FIG. 4) and also phase information (as shown in FIG. 5).

In one embodiment, the system for imaging magnetic field measurement and calibration further include a processing unit 216 which is adapted for obtaining actual magnetic field intensity according to the measurement magnetic resonance signal.

The processing unit 216 can obtain the actual magnetic field intensity according to frequency of the measurement magnetic resonance signal, which can be expressed as an equation shown below:

$$B(r, \theta, \varphi, t) = \frac{f(r, \theta, \varphi, t)}{\gamma}$$

where $(r,\theta,\phi)$ represents spatial coordinates of a point in polar coordinates form, and f represents frequency.

The processing unit 216 also can obtain an instantaneous actual magnetic field intensity according to phase information. Phase change accumulated in a time interval $\tau$ of the measurement sampling signal may be expressed as: $d\phi=\int_{t0}^{t0+\tau}\gamma B(r,\theta,\phi,t)dt$. If $\tau$ is short enough, the actual magnetic field intensity may be obtained according to an equation shown below:

$$B(r, \theta, \varphi, t0) = \frac{\int_{t0}^{t0+\tau} \gamma B(r, \theta, \varphi, t) dt}{\tau}$$

In some embodiments, the processing unit 216 can estimate the actual magnetic field intensity by according to other information of the measurement magnetic resonance signal, which is not limited in this disclosure.

Imaging magnetic field drift is a gradual change process with time. The control unit 214 is adapted for controlling the sampling unit to obtain a group of measurement magnetic resonance signals sampled at different time points. The processing unit 216 is adapted to establish a physical model of the actual magnetic field intensity based on the group of measurement magnetic resonance signals, in order to predict a change of the actual magnetic field intensity. Therefore, there is no need to sample data within a particular time interval, because the processing unit can obtain the imaging magnetic field within the particular time interval base on the physical model. After the particular time interval, a new group of measurement magnetic resonance signals will be sampled to modify the physical model. Therefore, signal sampling frequency can be reduced and measurement efficiency can be improved in this manner.

The system further includes a calibration unit 217. Under control of the control unit 216, the calibration unit is adapted for calibrating the imaging magnetic field in the magnetic resonance apparatus according to the actual magnetic field intensity obtained by the processing unit 216.

In one embodiment, the calibration unit 217 includes a first calculation unit (not shown) adapted for obtaining an imaging magnetic field calibration value according to a difference between the actual magnetic field intensity obtained by the processing unit 216 and a target magnetic field intensity, where the target magnetic field intensity is predetermined in the first calculation unit and the first calculation unit is connected to the processing unit 216.

It should be noted that, the target magnetic field intensity set in the first calculation unit is determined based on location, material, and quantity of the superconducting coil and the gradient coil and design specifications of image quality. A high quality image, which can meet design specifications, can be obtained based on the target imaging magnetic field. In one embodiment, the target imaging magnetic field may be expressed as $B_{00}$.

The first calculation unit may obtain the imaging magnetic field calibration value $\Delta$ according to an equation shown below:

$$\Delta = (B'_{00} - B_{00}) + GX + aX^2 + cX^3$$

where $B'_{00} - B_{00}$ represents a uniform deviation, GX represents a linear deviation, and $X^2 + cX^3$ represents a high-order deviation of the imaging magnetic field.

The calibration unit further includes a second calculation unit which is adapted for obtaining a current calibration value of magnetic component according to the imaging magnetic field calibration value.

The control unit 214 is connected to the calibration unit 217 and the magnetic components 214, and is adapted for controlling the current of a coil in the magnetic component 214 to calibrate the imaging magnetic field.

Specifically, different calibration targets and methods can be employed to calibrate the uniform deviation, the liner deviation and the high-order deviation. For example, after calculating G, which needs to be calibrated, in Equation (1) according to the measurement magnetic resonance signal, a current calibration value is calculated according to G. Assuming a calibration target is the current in the gradient coil, a current calibration value corresponding to the gradient coil needs to be calculated.

The control unit 214 is connected to the gradient coil 219, and is adapted for changing the current in the gradient coil 219 according to the current calibration value of the gradient coil 219, so as to calibrate the liner field.

It should be noted that, in some embodiments, a shim coil 213 adapted for providing a compensation imaging magnetic field is disposed in the magnetic resonance apparatus. The compensation imaging magnetic field cooperates with the imaging magnetic field provided by the magnetic component 212 to obtain a more uniform imaging magnetic field.

Correspondingly, besides the first calculation unit adapted for obtaining the imaging magnetic field calibration value according to a difference between the actual magnetic field intensity and a target magnetic field intensity, the calibration unit 217 further includes a third calculation unit which is adapted for obtaining a current calibration value of the shim coil 213 according to the imaging magnetic field calibration value.

The control unit 214 is also connected to the shim coil 213, and is adapted for calibrating the current in the shim coil 213 according to the current calibration value of the shim coil 213, so as to calibrate the liner deviation and the high-order deviation.

In some embodiments, the magnetic resonance apparatus further include a drift supply coil for main imaging magnetic field (referred to as $B_0$ coil for short) which is adapted for calibrating a drift of the main imaging magnetic field.

Besides the first calculation unit adapted for obtaining the imaging magnetic field calibration value according to the difference between the actual magnetic field intensity and the target magnetic field intensity, the calibration unit 217 further includes a fourth calculation unit which is adapted for obtaining a current calibration value of the drift supply coil for main imaging magnetic field according to the imaging magnetic field calibration value.

The control unit 214 is also connected to the drift supply coil for main imaging magnetic field, and is adapted for calibrating the current in the drift supply coil for main imaging magnetic field according to the current calibration value of the drift supply coil for main imaging magnetic field, so as to calibrate the uniform deviation.

It should be noted that, the control unit 214, the processing unit 216 and the calibration unit 217 may be integrated in a computer in practical applications.

The embodiments described above may calibrate an imaging magnetic field. The imaging magnetic field after calibration is more uniform and stable, whereby a high quality image may be obtained. But the scope of the present disclosure should not be limited thereto. In some embodiments, the system further includes an image reconstruction unit, which is connected to the calibration unit and is adapted for performing image reconstruction in combination with the difference between the actual magnetic field intensity and the target magnetic field intensity provided by the calibration unit, so as to output a calibrated and high quality image.

It should be noted that, the embodiments described above perform measurement based on the magnetic resonance principle. But the scope of the present disclosure should not be limited thereto. The electromagnetic induction principle may be used to measure the imaging magnetic field.

Specifically, the sampling unit may include an induction coil adapted for inducing a change in an imaging magnetic field to form an alternating electromotive force corresponding to the imaging magnetic field; and a processing unit adapted for obtaining an actual magnetic field intensity according to the alternating electromotive force based on the electromagnetic induction principle. After the measurement performed based on the electromagnetic induction principle, a magnetic field calibration, which is similar to the calibration method mentioned in the above embodiments, is performed. Those skilled in the art can modify and vary the system according to embodiments mentioned above.

Although the present disclosure has been disclosed above with reference to preferred embodiments thereof, it should be understood that the disclosure is presented by way of example only, and not limitation. Those skilled in the art can modify and vary the embodiments without departing from the spirit and scope of the present disclosure.

What is claimed is:

1. An MRI method for measuring and calibrating an imaging magnetic field in a magnetic resonance apparatus connected to a computer, comprising:
    providing the imaging magnetic field including a main imaging magnetic field and a gradient magnetic field, where the imaging magnetic field is configured to scan an object to be imaged;
    sampling, by a probe, a signal corresponding to the imaging magnetic field;
    processing, by the computer, the signal to obtain an actual magnetic field intensity;
    obtaining, by the computer, an imaging magnetic field calibration value based on a difference between the actual magnetic field intensity and the target magnetic field intensity;
    obtaining, by the computer, a current calibration value of the magnetic component according to the imaging magnetic field calibration value; and
    calibrating, by the computer, the imaging magnetic field provided by the magnetic component based on the current calibration value of the magnetic component, where the difference between the actual magnetic field intensity and the target magnetic field intensity is divided into a uniform deviation, a linear deviation and a high-order deviation after calculation.

2. The method according to claim 1, wherein the step of providing the imaging magnetic field comprises: providing the imaging magnetic field by a magnetic component in the magnetic resonance apparatus;

the step of sampling a signal corresponding to the imaging magnetic field comprises: providing a measurement RF signal to stimulate a monitoring sample and generate a measurement magnetic resonance signal corresponding to the imaging magnetic field; and sampling the measurement magnetic resonance signal; and the step of processing the signal to obtain an actual magnetic field intensity comprises: obtaining the actual magnetic field intensity according to the measurement magnetic resonance signal based on magnetic resonance principle.

3. The method according to claim 2, wherein the step of providing a measurement RF signal comprises: providing the measurement RF signal by a probe or a body coil fixed in the magnetic component.

4. The method according to claim 3, wherein in the step of providing a measurement RF signal to stimulate a monitoring sample, the monitoring sample generates the measurement magnetic resonance signal corresponding to the imaging magnetic field.

5. The method according to claim 2, wherein a method for forming the measurement RF signal comprises: adopting protons as the monitoring sample to generate the measurement RF signal, where the protons are same with or different from protons in an imaging process.

6. The method according to claim 1, wherein the imaging magnetic field is measured and calibrated before scanning the object to be imaged.

7. The method according to claim 1, wherein the imaging magnetic field is measured and calibrated in a process of scanning the object to be imaged.

8. The method according to claim 2, wherein the step of sampling the measurement magnetic resonance signal comprises: obtaining the measurement magnetic resonance signal in a manner of multiple-stimulation and multiple-sampling, or in a manner of single-stimulation and multiple-sampling.

9. The method according to claim 2, wherein the step of sampling the measurement magnetic resonance signal comprises: sampling a group of measurement magnetic resonance signals; and the step of processing the signal to obtain an actual magnetic field intensity comprises: establishing a physical model of the actual magnetic field intensity based on the group of measurement magnetic resonance signals, so as to predict change of the actual magnetic field intensity.

10. The method according to claim 1, wherein the magnetic component comprises a gradient coil;

the step of obtaining a current calibration value of the magnetic component according to the imaging magnetic field calibration value comprises: obtaining a current calibration value of the gradient coil according to the imaging magnetic field calibration value; and the step of calibrating the imaging magnetic field provided by the magnetic component based on the current calibration value of the magnetic component comprises: calibrating a current of the gradient coil to calibrate the linear deviation.

11. The method according to claim 10, wherein the magnetic component further comprises a shim coil;

the step of obtaining a current calibration value of the magnetic component according to the imaging magnetic field calibration value comprises: obtaining a current calibration value of the shim coil according to the imaging magnetic field calibration value; and the step of calibrating the imaging magnetic field provided by the magnetic component based on the current calibration value of the magnetic component comprises: calibrating a current of the shim coil to calibrate the linear deviation and the high-order deviation.

12. The method according to claim 10, wherein the magnetic component further comprises a drift supply coil for a main imaging magnetic field;

the step of obtaining a current calibration value of the magnetic component according to the imaging magnetic field calibration value comprises: obtaining a current calibration value of the drift supply coil for the main imaging magnetic field according to the imaging magnetic field calibration value; and the step of calibrating the imaging magnetic field provided by the magnetic component based on the current calibration value of the magnetic component comprises: calibrating a current of the drift supply coil for the main imaging magnetic field to calibrate the uniform deviation.

13. The method according to claim 11, wherein the magnetic component further comprises a drift supply coil for a main imaging magnetic field;

the step of obtaining a current calibration value of the magnetic component according to the imaging magnetic field calibration value comprises: obtaining a current calibration value of the drift supply coil for the main imaging magnetic field according to the imaging magnetic field calibration value; and the step of calibrating the imaging magnetic field provided by the magnetic component based on the current calibration value of the magnetic component comprises: calibrating a current of the drift supply coil for the main imaging magnetic field to calibrate the uniform deviation.

14. The method according to claim 2, wherein the magnetic component further performs image reconstruction; and the step of performing calibration based on a difference between the actual magnetic field intensity and a target magnetic field intensity comprises: performing the image reconstruction according to data obtained by the actual magnetic field intensity in combination with the difference between the actual magnetic field intensity and the target magnetic field intensity, so as to output a calibrated image.

15. The method according to claim 1, wherein the step of sampling a signal corresponding to the imaging magnetic field comprises: inducing a change of the imaging magnetic field to form an alternating electromotive force corresponding to the imaging magnetic field, and sampling the alternating electromotive force; and the step of processing the signal to obtain an actual magnetic field intensity comprises: obtaining the actual magnetic field intensity according to the alternating electromotive force based on electromagnetic induction principle.

16. An MRI system for measuring and calibrating an imaging magnetic field in a magnetic resonance apparatus, comprising:

a magnetic component configured to scan an object to be imaged;

a sampling unit configured to sample a signal corresponding to the imaging magnetic field;

a processing unit configured to process the signal to obtain an actual magnetic field intensity;

a calibration unit configured to perform calibration based on a difference between the actual magnetic field intensity and a target magnetic field intensity;

a control unit, connected to the magnetic component, the sampling unit, the processing unit and the calibration unit, and configured to control the magnetic component to provide the imaging magnetic field including a main imaging magnetic field and a gradient magnetic field, control the sampling unit to sample the signal, control the processing unit to process the signal, and control the calibration unit to calibrate the imaging magnetic field, wherein the calibration unit includes:

a first calculation unit configured to obtain an imaging magnetic field calibration value according to the difference between the actual magnetic field intensity and the target magnetic field intensity;

a second calculation unit configured to obtain a current calibration value of the magnetic component according to the imaging magnetic field calibration value;

where the control unit is connected to the second calculation unit and the magnetic component, and configured to change a current in the magnetic component according to the current calibration value of the magnetic component, so as to calibrate the imaging magnetic field, and the difference between the actual magnetic field intensity and the target magnetic field intensity is divided into a uniform deviation, a linear deviation and a high-order deviation after calculation.

17. The system according to claim 16, wherein the sampling unit comprises: a plurality of probes configured to, after a measurement RF signal stimulates a plurality of monitoring samples and generates a measurement magnetic resonance signal corresponding to the measurement RF signal, sample the measurement magnetic resonance signal;

a sampling channel configured to transmit the measurement magnetic resonance signal; and the processing unit is configured to obtain the actual magnetic field intensity according to the measurement magnetic resonance signal based on magnetic resonance principle.

18. The system according to claim 17, wherein the plurality of monitoring samples is disposed in the plurality of probes, where the plurality of monitoring samples are same with or different from a sample which generates an imaging magnetic resonance signal.

19. The system according to claim 17, wherein the plurality of probes are fixed on a surface of the magnetic component.

20. The system according to claim 17, wherein the magnetic resonance apparatus further includes a local coil, and the plurality of probes are embedded in the local coil.

21. The system according to claim 17, wherein the plurality of probes are distributed on a gradient orthogonal axes.

22. The system according to claim 21, wherein the number of the plurality of probes is at least four, and the plurality of probes are distributed on three gradient orthogonal axes symmetrically.

23. The system according to claim 17, wherein the plurality of probes are transmitting-receiving RF coils, or transmitting RF coils.

24. The system according to claim 17, wherein each of the plurality of probes has an adjacent wing at one side.

25. The system according to claim 17, wherein the plurality of probes have a solenoid structure.

26. The system according to claim 17, wherein the magnetic resonance apparatus further comprises a body coil configured to adapt the measurement RF signal and an imaging RF signal;

the magnetic component comprises a gradient coil, and the control unit is connected to the gradient coil, the body coil, the plurality of probes and the sampling channel, where the control unit is configured to control the gradient coil to provide the imaging magnetic field and control the body coil to provide the imaging RF signal, so as to generate the imaging magnetic resonance signal; and the control unit is further configured to control the body coil to provide the measurement RF signal, control the plurality of probes to sample the measurement magnetic resonance signal, and control the sampling channel to transmit the imaging magnetic resonance signal and the measurement magnetic resonance signal synchronously, in a process of magnetic resonance imaging.

27. The system according to claim 26, wherein the sampling channel comprises a plurality of channels, where a part of the plurality of channels are used to transmit the imaging magnetic resonance signal, and others are used to transmit the measurement magnetic resonance signal.

28. The system according to claim 17, wherein the magnetic resonance apparatus further comprises a body coil configured to provide the measurement RF signal and an imaging RF signal;

the magnetic component comprises a gradient coil, and the control unit is connected to the gradient coil, the body coil, the plurality of probes and the sampling channel, where the control unit is configured to control the gradient coil to provide the imaging magnetic field, control the body coil to provide the measurement RF signal, control the plurality of probes to sample the measurement magnetic resonance signal, and control the sampling channel to transmit the measurement magnetic resonance signal, before a process of magnetic resonance imaging.

29. The system according to claim 26, wherein the control unit controls the body coil to stimulate the monitoring sample once or multiple times, and control the plurality of probes to sample the measurement magnetic resonance signal multiple times.

30. The system according to claim 28, wherein the control unit controls the body coil to stimulate the monitoring sample once or multiple times, and control the plurality of probes to sample the measurement magnetic resonance signal multiple times.

31. The system according to claim 17, wherein the control unit is configured to control the plurality of probes to sample a group of measurement magnetic resonance signals, the processing unit is configured to establish a physical model of the actual magnetic field intensity based on the group of measurement magnetic resonance signals, so as to predict change of the actual magnetic field intensity.

32. The system according to claim 16, wherein the magnetic component comprises a gradient coil;

the first calculation unit is configured to obtain an imaging magnetic field calibration value of a linear field according to the difference between the actual magnetic field intensity and the target magnetic field intensity;

the second calculation unit is configured to obtain a current calibration value of the gradient coil according to the imaging magnetic field calibration value of the linear field; and the control unit is connected to the second calculation unit and the gradient coil, and configured to calibrate a current of the gradient coil according to the current calibration value of the gradient coil, so as to calibrate the linear deviation.

33. The system according to claim 32, wherein the magnetic component further comprises a shim coil configured to provide a compensation imaging magnetic field;
the calibration unit further comprises: a third calculation unit configured to obtain a current calibration value of the shim coil according to the imaging magnetic field calibration value; and
the control unit is connected to the third calculation unit and the shim coil, and configured to change a current in the shim coil according to the current calibration value of the shim coil, so as to calibrate the linear deviation and the high-order deviation.

34. The system according to claim 32, wherein the magnetic component further comprises a drift supply coil for main imaging magnetic field which is configured to provide a compensation imaging magnetic field;
the calibration unit further comprises: a fourth calculation unit configured to obtain a current calibration value of the drift supply coil for main imaging magnetic field according to the imaging magnetic field calibration value; and
the control unit is connected to the fourth calculation unit and the drift supply coil for main imaging magnetic field, and configured to change a current in the drift supply coil for main imaging magnetic field according to the current calibration value of the drift supply coil for main imaging magnetic field, so as to calibrate the uniform deviation.

35. The system according to claim 33, wherein the magnetic component further comprises a drift supply coil for main imaging magnetic field which is configured to provide a compensation imaging magnetic field;
the calibration unit further comprises: a fourth calculation unit configured to obtain a current calibration value of the drift supply coil for main imaging magnetic field according to the imaging magnetic field calibration value; and
the control unit is connected to the fourth calculation unit and the drift supply coil for main imaging magnetic field, and configured to change a current in the drift supply coil for main imaging magnetic field according to the current calibration value of the drift supply coil for main imaging magnetic field, so as to calibrate the uniform deviation.

36. The system according to claim 17, wherein the magnetic component further comprises an image reconstruction unit, where the image reconstruction unit is connected to the calibration unit, and configured to reconstruct an image according to data obtained by the actual magnetic field intensity in combination with the difference between the actual magnetic field intensity and the target magnetic field intensity, so as to output a calibrated image.

37. The system according to claim 16, wherein the sampling unit comprises an induction coil configured to induce a change of the imaging magnetic field to form an alternating electromotive force corresponding to the imaging magnetic field; and
the processing unit is configured to obtain an actual magnetic field intensity according to the alternating electromotive force based on an electromagnetic induction principle.

38. An MRI system for measuring and calibrating an imaging magnetic field in a magnetic resonance apparatus, comprising:
a magnetic component configured to scan an object to be imaged;
a sampling unit configured to sample a signal corresponding to the imaging magnetic field;
a processing unit configured to process the signal to obtain an actual magnetic field intensity;
a calibration unit configured to perform calibration based on a difference between the actual magnetic field intensity and a target magnetic field intensity, wherein performing calibration comprises calibrating the imaging magnetic field; and
a control unit, connected to the magnetic component, the sampling unit, the processing unit and the calibration unit, and configured to control the magnetic component to provide the imaging magnetic field including a main imaging magnetic field and a gradient magnetic field, control the sampling unit to sample the signal, control the processing unit to process the signal, and control the calibration unit to calibrate the imaging magnetic field,
wherein the sampling unit comprises:
a plurality of probes configured to, after a measurement RF signal stimulates a plurality of monitoring samples and generates a measurement magnetic resonance signal corresponding to the measurement RF signal, sample the measurement magnetic resonance signal; and
a sampling channel configured to transmit the measurement magnetic resonance signal, wherein
the processing unit is configured to obtain the actual magnetic field intensity according to the measurement magnetic resonance signal based on magnetic resonance principle, and
the plurality of probes include a magnetic material configured to generate a local magnetic field to compensate the imaging magnetic field.

39. The system according to claim 38, wherein the local magnetic field changes with a voltage applied on the magnetic material, so as to calibrate a local distribution of the imaging magnetic field.

* * * * *